(12) United States Patent
Jeong et al.

(10) Patent No.: US 10,332,578 B2
(45) Date of Patent: Jun. 25, 2019

(54) SEMICONDUCTOR DEVICE

(71) Applicant: SK hynix Inc., Icheon-si, Gyeonggi-do (KR)

(72) Inventors: Sang Hoon Jeong, Yeoju-si (KR); Hyun Ju Ham, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/703,054

(22) Filed: Sep. 13, 2017

(65) Prior Publication Data

US 2018/0108394 A1   Apr. 19, 2018

(30) Foreign Application Priority Data

Oct. 17, 2016 (KR) .......................... 10-2016-0134099

(51) Int. Cl.

| | |
|---|---|
| *G11C 11/24* | (2006.01) |
| *G11C 5/02* | (2006.01) |
| *G11C 5/14* | (2006.01) |
| *G11C 8/12* | (2006.01) |
| *G11C 11/4074* | (2006.01) |
| *G11C 7/18* | (2006.01) |
| *G11C 11/408* | (2006.01) |
| *G11C 11/4097* | (2006.01) |

(52) U.S. Cl.
CPC ............... *G11C 11/24* (2013.01); *G11C 5/02* (2013.01); *G11C 5/147* (2013.01); *G11C 8/12* (2013.01); *G11C 11/4074* (2013.01); *G11C 5/025* (2013.01); *G11C 7/18* (2013.01); *G11C 11/408* (2013.01); *G11C 11/4097* (2013.01)

(58) Field of Classification Search
CPC .................................. G11C 5/025; G11C 5/04
USPC ............................................................ 365/51
See application file for complete search history.

(56) References Cited

U.S. PATENT DOCUMENTS

2003/0202395 A1* 10/2003 Lee ..................... G11C 11/4074
                                                                    365/200

FOREIGN PATENT DOCUMENTS

KR        1020080044401 A        5/2008

* cited by examiner

*Primary Examiner* — Hoai V Ho
*Assistant Examiner* — Minh Dinh
(74) *Attorney, Agent, or Firm* — William Park & Associates Ltd.

(57) ABSTRACT

A semiconductor memory device may include first to fourth data storage regions. The semiconductor memory device may include a first to fourth capacitor groups and a voltage-generating circuit. The first capacitor group may be arranged adjacent to the first data storage region to provide the first data storage region with a first stabilizing voltage. The second capacitor group may be arranged adjacent to the second data storage region to provide the second data storage region with a second stabilizing voltage. The third capacitor group may be arranged adjacent to the third data storage region to provide the third data storage region with a third stabilizing voltage. The fourth capacitor group may be arranged adjacent to the fourth data storage region to provide the fourth data storage region with a fourth stabilizing voltage. The voltage-generating circuit may be configured to provide the first to fourth capacitor groups with an internal voltage.

5 Claims, 3 Drawing Sheets

SEMICONDUCTOR DEVICE

CROSS-REFERENCES TO RELATED APPLICATION

The present application claims priority under 35 U.S.C. § 119(a) to Korean application number 10-2016-0134099, filed on Oct. 17, 2016 in the Korean Intellectual Property Office, which is incorporated herein by reference in its entirety.

BACKGROUND

1. Technical Field

Various embodiments may generally relate to a semiconductor device, and more particularly, to a semiconductor memory device.

2. Related Art

A semiconductor memory device receives a power voltage from an external device. The semiconductor memory device generates an internal voltage having a voltage level required in the semiconductor memory device. The semiconductor memory device consists of internal circuits operated by the internal voltage.

The semiconductor memory device has been developed to decrease power consumption and improve area efficiency by reducing an area of the internal circuits.

SUMMARY

According to an embodiment, there may be provided a semiconductor memory device. The semiconductor memory device may include a first data storage region, a second data storage region, a third data storage region, and a fourth data storage region. The semiconductor memory device may include a first capacitor group, a second capacitor group, a third capacitor group, a fourth capacitor group, and a voltage-generating circuit. The first capacitor group may be arranged adjacent to the first data storage region to provide the first data storage region with a first stabilizing voltage. The second capacitor group may be arranged adjacent to the second data storage region to provide the second data storage region with a second stabilizing voltage. The third capacitor group may be arranged adjacent to the third data storage region to provide the third data storage region with a third stabilizing voltage. The fourth capacitor group may be arranged adjacent to the fourth data storage region to provide the fourth data storage region with a fourth stabilizing voltage. The voltage-generating circuit may be configured to provide the first to fourth capacitor groups with an internal voltage.

According to an embodiment, there may be provided a semiconductor memory device. The semiconductor memory device may include a plurality of data storage regions, a plurality of capacitor groups and a voltage-generating circuit. The capacitor groups may be configured to provide the data storage regions with stabilizing voltages. The voltage-generating circuit may be configured to provide the capacitor groups with an internal voltage. Each of the capacitor groups may include a plurality of capacitors.

DETAILED DESCRIPTION

Figure 1:
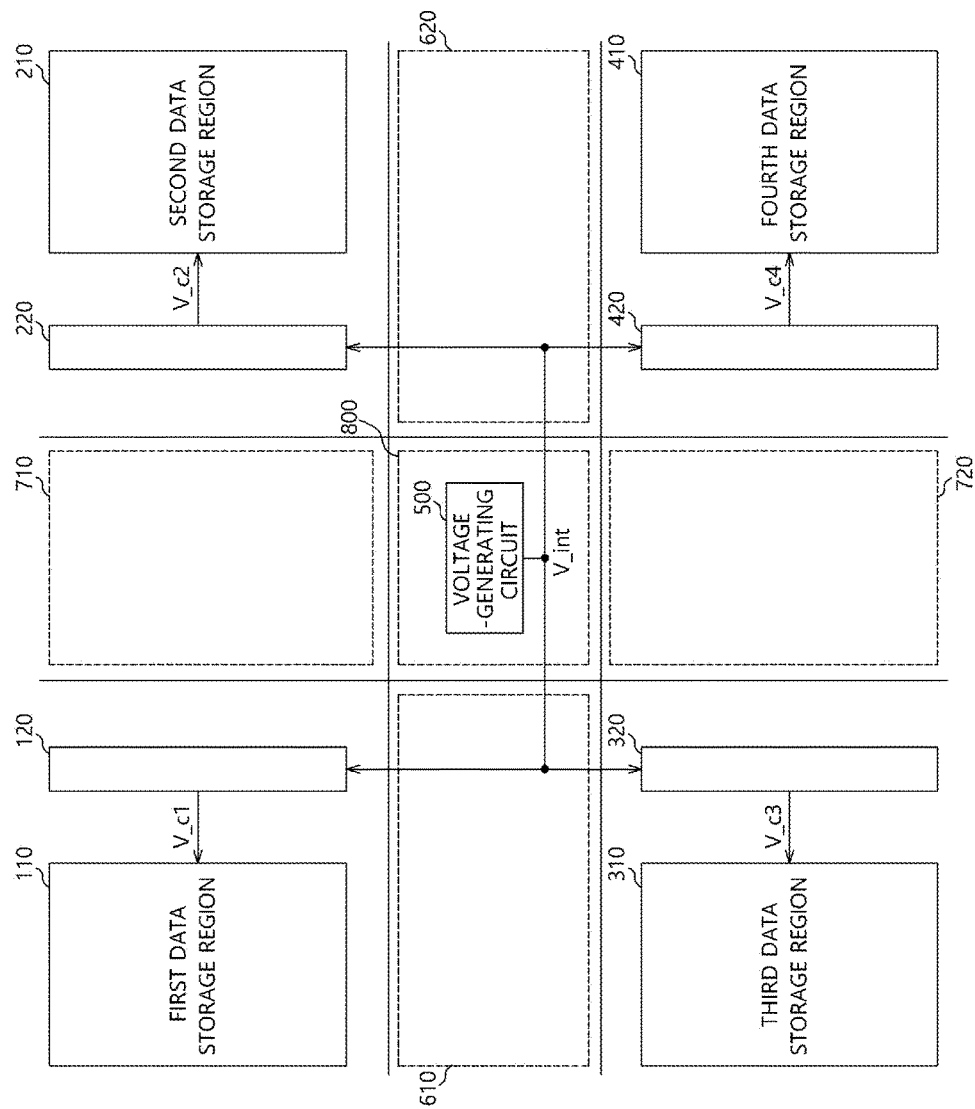
FIG. 1 is a block diagram illustrating a semiconductor memory device in accordance with examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

Hereinafter, examples of the embodiments will be explained with reference to the accompanying drawings.

FIG. 1 is a block diagram illustrating a semiconductor memory device in accordance with examples of the embodiments.

Referring to FIG. 1, an example of an embodiment of a semiconductor memory device may include a first data storage region 110, a second data storage region 210, a third data storage region 310, a fourth data storage region 410, a first capacitor group 120, a second capacitor group 220, a third capacitor group 320, a fourth capacitor group 420, a first peripheral circuit region 610 in a column direction, a second peripheral circuit region 620 in the column direction, a first peripheral circuit region 710 in a row direction, a second peripheral circuit region 720 in the row direction and an X-hole 800.

The first to fourth data storage regions 110, 210, 310 and 410 may be configured to store data. The first to fourth data storage regions 110, 210, 310 and 410 may include a plurality of MATs. Each of the MATs may include a plurality of memory cells.

The first capacitor group 120 may be arranged closer to the first data storage region 110 among the first to fourth data storage regions 110, 210, 310 and 410 to provide the first data storage region 110 with a first stabilizing voltage V_c1. The first capacitor group 120 may include a plurality of capacitors.

The second capacitor group 220 may be arranged closer to the second data storage region 210 among the first to fourth data storage regions 110, 210, 310 and 410 to provide the second data storage region 210 with a second stabilizing voltage V_c2. The second capacitor group 220 may include a plurality of capacitors.

The third capacitor group 320 may be arranged closer to the third data storage region 310 among the first to fourth data storage regions 110, 210, 310 and 410 to provide the third data storage region 310 with a third stabilizing voltage V_c3. The third capacitor group 320 may include a plurality of capacitors.

The fourth capacitor group 420 may be arranged closer to the fourth data storage region 410 among the first to fourth data storage regions 110, 210, 310 and 410 to provide the fourth data storage region 410 with a fourth stabilizing voltage V_c4. The fourth capacitor group 420 may include a plurality of capacitors.

The first peripheral circuit region 610 in the column direction may be arranged between the first data storage region 110 and the third data storage region 310. A buffer, a driver, a decoder, and a sense amplifier for transmitting column signals and data to the first and third data storage regions 110 and 310 may be arranged in the first peripheral circuit region 610 in the column direction.

The second peripheral circuit region 620 in the column direction may be arranged between the second data storage region 210 and the fourth data storage region 410. A buffer, a driver, a decoder, and a sense amplifier for transmitting column signals and data to the second and fourth data storage regions 210 and 410 may be arranged in the second peripheral circuit region 620 in the column direction.

The first peripheral circuit region 710 in the row direction may be arranged between the first data storage region 110 and the second data storage region 210. A buffer, a driver and a decoder for transmitting row signals and data to the first and second data storage regions 110 and 210 may be arranged in the first peripheral circuit region 710 in the row direction.

The second peripheral circuit region 720 in the column direction may be arranged between the third data storage region 310 and the fourth data storage region 410. A buffer, a driver, and a decoder for transmitting row signals and data to the third and fourth data storage regions 310 and 410 may be arranged in the second peripheral circuit region 720 in the row direction.

The X-hole 800 may be arranged between the first and second peripheral circuit regions 610 and 620 in the column direction and between the first and second peripheral circuit regions 710 and 720 in the row direction. A voltage-generating circuit 500 may be arranged in the X-hole 800.

The voltage-generating circuit 500 may receive a power voltage from an external device. The voltage-generating circuit 500 may generate an internal voltage V_int having a voltage level required in the semiconductor memory device.

The voltage-generating circuit 500 may provide the first to fourth capacitor groups 120, 220, 320 and 420 with the internal voltage V_int.

The first capacitor group 120 may receive the internal voltage V_int. The first capacitor group 120 may provide the first data storage region 110 with the first stabilizing voltage V_c1.

The second capacitor group 220 may receive the internal voltage V_int. The second capacitor group 220 may provide the second data storage region 210 with the second stabilizing voltage V_c2.

The third capacitor group 320 may receive the internal voltage V_int. The third capacitor group 320 may provide the third data storage region 310 with the third stabilizing voltage V_c3.

The fourth capacitor group 420 may receive the internal voltage V_int. The fourth capacitor group 420 may provide the fourth data storage region 410 with the fourth stabilizing voltage V_c4.

Figure 2:
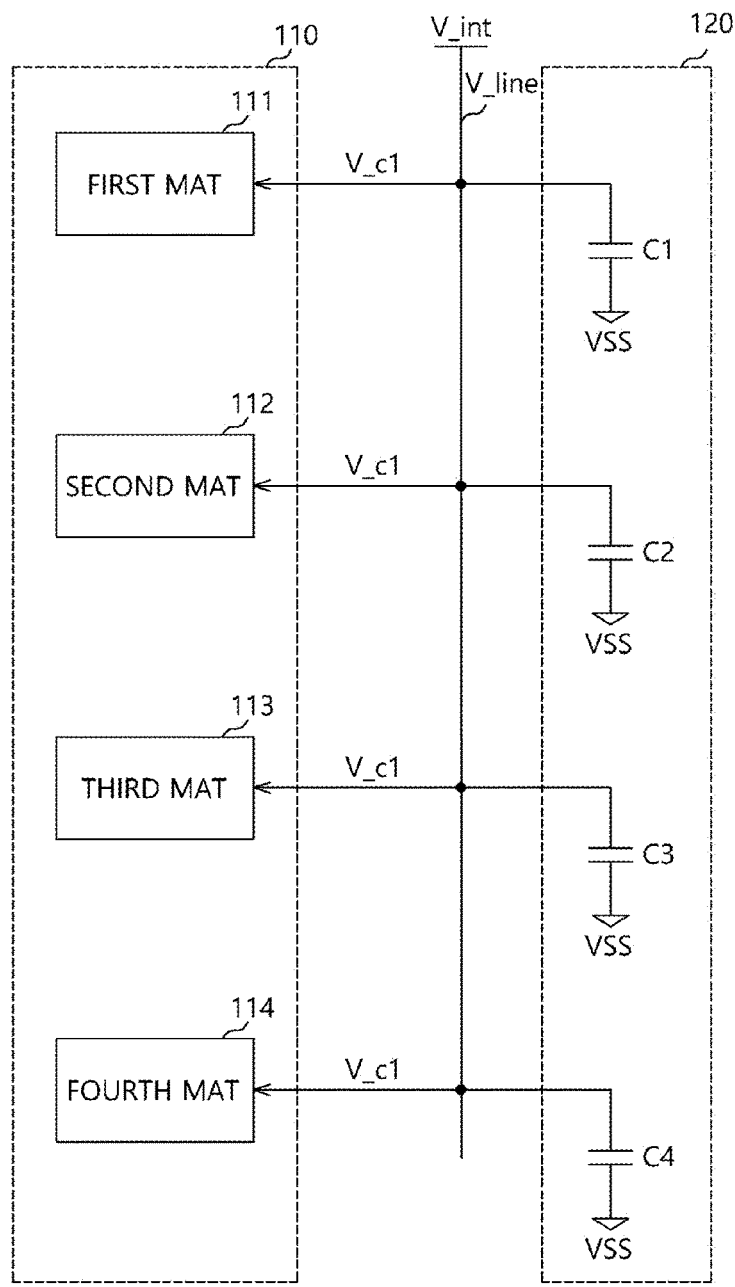
FIG. 2 is a block diagram illustrating a first data storage region and a first capacitor group of the semiconductor memory device in FIG. 1.

FIG. 2 is a block diagram illustrating a first data storage region and a first capacitor group of the semiconductor memory device in FIG. 1.

Referring to FIG. 2, the first data storage region 110 may include first to fourth MATs 111, 112, 113 and 114. The first capacitor group 120 may include the first to fourth capacitors C1, C2, C3 and C4. Alternatively, the first data storage region 110 may include one, two, three, or at least five MATs. Further, the first capacitor group 120 may include one, two, three, or at least five capacitors.

Each of the first to fourth capacitors C1, C2, C3, and C4 may have one end connected to a voltage line V_line through which the internal voltage V_int may be transmitted, and the other end connected to a ground voltage VSS terminal. The voltage line V_line may be connected to the first to fourth MATs 111, 112, 113 and 114. The internal voltage V_int as the first stabilizing voltage V_c1 may be transmitted to the first to fourth MATs 111, 112, 113 and 114 through the voltage line V_int connected with the first to fourth capacitors C1, C2, C3 and C4.

The second to fourth data storage regions 210, 310 and 410 may have configurations substantially the same as those of the first data storage region 110. The second to fourth capacitor groups 220, 320 and 420 may have configurations substantially the same as those of the first capacitor group 120.

Hereinafter, operations of the semiconductor memory device in accordance with examples of embodiments will be illustrated.

The voltage-generating circuit 500 may be arranged in the X-hole 800. The voltage-generating circuit 500 may provide the first to fourth capacitor groups 120, 220, 320, and 420 with the internal voltage V_int.

Each of the first to fourth capacitor groups 120, 220, 320 and 420 may include the first to fourth capacitors C1, C2, C3, and C4. The first to fourth capacitor groups 120, 220, 320, and 420 may provide the first to fourth data storage regions 110, 210, 310, and 410 with the first to fourth stabilizing voltages V_c1, V_c2, V_c3, and V_c4, respectively, through the voltage line V_line connected with the capacitors C1, C2, C3, and C4.

According to examples of the embodiments, the semiconductor memory device may provide the data storage regions with the stabilizing voltages using the single voltage-generating circuit. The capacitor groups may be arranged adjacent to the data storage regions, respectively. The capacitors may be charged with the internal voltage generated from the voltage-generating circuit through the voltage line. The internal voltage and the voltages in the capacitors as the stabilizing voltages may be transmitted to the data storage regions. Because the stabilizing voltages may be provided to the data storage regions using the single voltage-generating circuit, area efficiency of the semiconductor memory device may be improved. Further, because the stabilizing voltages may be transmitted to the data storage regions using only the capacitors, power consumption may be reduced so that power efficiency may be increased.

Figure 3:
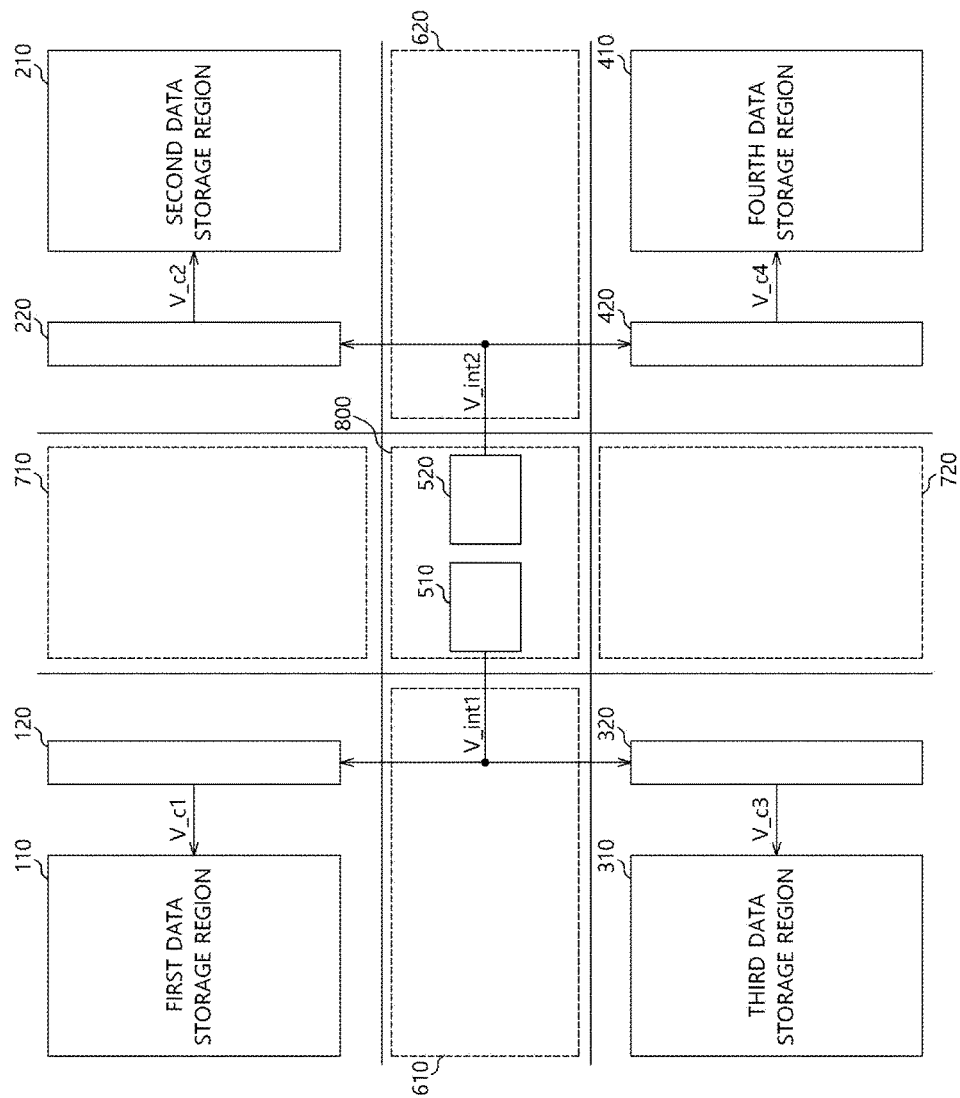
FIG. 3 is a block diagram illustrating a semiconductor memory device in accordance with examples of embodiments.

FIG. 3 is a block diagram illustrating a semiconductor memory device in accordance with examples of the embodiments.

Referring to FIG. 3, an example of an embodiment of a semiconductor memory device may include a first data storage region 110, a second data storage region 210, a third data storage region 310, a fourth data storage region 410, a first capacitor group 120, a second capacitor group 220, a third capacitor group 320, a fourth capacitor group 420, a first peripheral circuit region 610 in a column direction, a second peripheral circuit region 620 in the column direction, a first peripheral circuit region 710 in a row direction, a second peripheral circuit region 720 in the row direction and an X-hole 800.

The first to fourth data storage regions 110, 210, 310, and 410 may be configured to store data. The first to fourth data storage regions 110, 210, 310, and 410 may include a plurality of MATs. Each of the MATs may include a plurality of memory cells.

The first capacitor group 120 may be arranged closer to the first data storage region 110 among the first to fourth data storage regions 110, 210, 310 and 410 to provide the first data storage region 110 with a first stabilizing voltage V_c1. The first capacitor group 120 may include a plurality of capacitors.

The second capacitor group 220 may be arranged closer to the second data storage region 210 among the first to fourth data storage regions 110, 210, 310 and 410 to provide the second data storage region 210 with a second stabilizing voltage V_c2. The second capacitor group 220 may include a plurality of capacitors.

The third capacitor group 320 may be arranged closer to the third data storage region 310 among the first to fourth data storage regions 110, 210, 310 and 410 to provide the third data storage region 310 with a third stabilizing voltage V_c3. The third capacitor group 320 may include a plurality of capacitors.

The fourth capacitor group 420 may be arranged closer to the fourth data storage region 410 among the first to fourth data storage regions 110, 210, 310 and 410 to provide the fourth data storage region 410 with a fourth stabilizing voltage V_c4. The fourth capacitor group 420 may include a plurality of capacitors.

The first peripheral circuit region 610 in the column direction may be arranged between the first data storage region 110 and the third data storage region 310. A buffer, a driver, a decoder, and a sense amplifier for transmitting column signals and data to the first and third data storage regions 110 and 310 may be arranged in the first peripheral circuit region 610 in the column direction.

The second peripheral circuit region 620 in the column direction may be arranged between the second data storage region 210 and the fourth data storage region 410. A buffer, a driver, a decoder, and a sense amplifier for transmitting column signals and data to the second and fourth data storage regions 210 and 410 may be arranged in the second peripheral circuit region 620 in the column direction.

The first peripheral circuit region 710 in the row direction may be arranged between the first data storage region 110 and the second data storage region 210. A buffer, a driver, and a decoder for transmitting row signals and data to the first and second data storage regions 110 and 210 may be arranged in the first peripheral circuit region 710 in the row direction.

The second peripheral circuit region 720 in the column direction may be arranged between the third data storage region 310 and the fourth data storage region 410. A buffer, a driver, and a decoder for transmitting row signals and data to the third and fourth data storage regions 310 and 410 may be arranged in the second peripheral circuit region 720 in the row direction.

The X-hole 800 may be arranged between the first and second peripheral circuit regions 610 and 620 in the column direction and between the first and second peripheral circuit regions 710 and 720 in the row direction. A first voltage-generating circuit 510 and a second voltage-generating circuit 520 may be arranged in the X-hole 800.

The first and second voltage-generating circuits 510 and 520 may receive a power voltage from an external device. The first and second voltage-generating circuits 510 and 520 may generate first and second internal voltages V_int1 and V_int2 having voltage levels required in the semiconductor memory device. The voltage level of the first internal voltage V_int1 may be substantially equal to or different from the voltage level of the second internal voltage V_int2.

The first voltage-generating circuit 510 may provide the first and third capacitor groups 120 and 320 with the first internal voltage V_int1.

The second voltage-generating circuit 520 may provide the second and fourth capacitor groups 220 and 420 with the second internal voltage V_int2.

The first capacitor group 120 may receive the first internal voltage V_int1. The first capacitor group 120 may provide the first data storage region 110 with the first stabilizing voltage V_c1.

The second capacitor group 220 may receive the second internal voltage V_int2. The second capacitor group 220 may provide the second data storage region 210 with the second stabilizing voltage V_c2.

The third capacitor group 320 may receive the first internal voltage V_int1. The third capacitor group 320 may provide the third data storage region 310 with the third stabilizing voltage V_c3.

The fourth capacitor group 420 may receive the second internal voltage V_int2. The fourth capacitor group 420 may provide the fourth data storage region 410 with the fourth stabilizing voltage V_c4.

The first data storage region 110 and the first capacitor group 120 in FIG. 3 may have configurations substantially the same as those in FIG. 2. The second to fourth data storage regions 210, 310, and 410 may have configurations substantially the same as those of the first data storage region 110. The second to fourth capacitor groups 220, 320, and 420 may have configurations substantially the same as those of the first capacitor group 120.

Hereinafter, operations of the semiconductor memory device in accordance with examples of the embodiments may be illustrated.

The first voltage-generating circuit 510 may be arranged in the X-hole 800. The first voltage-generating circuit 510 may provide the first and third capacitor groups 120 and 320 with the first internal voltage V_int1.

The second voltage-generating circuit 520 may be arranged in the X-hole 800. The second voltage-generating circuit 520 may provide the second and fourth capacitor groups 220 and 420 with the second internal voltage V_int2.

Each of the first to fourth capacitor groups 120, 220, 320, and 420 may include the first to fourth capacitors C1, C2, C3, and C4.

The first to fourth capacitor groups 120, 220, 320, and 420 may provide the first to fourth data storage regions 110, 210, 310, and 410 with the first and second internal voltages V_int1 and V_int 2 as the first to fourth stabilizing voltages V_c1, V_c2, V_c3, and V_c4, respectively, through the voltage line V_line connected with the capacitors C1, C2, C3, and C4.

According to the examples of the embodiments, the semiconductor memory device may provide the data storage regions with the stabilizing voltages using the two voltage-generating circuits. The capacitor groups may be arranged adjacent to the data storage regions, respectively. The capacitors may be charged with the internal voltages generated from the voltage-generating circuit through the voltage line. The internal voltages and the voltages in the capacitors as the stabilizing voltages may be transmitted to the data storage regions. Because the stabilizing voltages may be provided to the data storage regions using the two voltage-generating circuits, area efficiency of the semiconductor memory device may be improved. Further, because the stabilizing voltages may be transmitted to the data storage regions using only the capacitors, power consumption may be reduced so that power efficiency may be increased.

The above embodiments of the present description are illustrative and not limitative. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor memory device comprising:
   a plurality of data storage regions;
   a plurality of capacitor groups configured to provide the data storage regions with stabilizing voltages;
   a voltage-generating circuit configured to provide the capacitor groups with an internal voltage,
   wherein each of the capacitor groups comprises a plurality of capacitors,
   a peripheral circuit region in a row direction configured to transmit a row signal to the data storage regions;
   a peripheral circuit region in a column direction configured to transmit a column signal to the data storage regions; and
   an X-hole arranged between the peripheral circuit region in the row direction and the peripheral circuit region in the column direction,
   wherein the voltage-generating circuit is arranged in the X-hole,
   wherein the X-hole comprises a first voltage-generating circuit and a second voltage-generating circuit,
   wherein the first voltage-generating circuit provides at least one capacitor group with a first internal voltage from the first voltage-generating circuit, and
   wherein the second voltage-generating circuit provides at least one capacitor group with a second internal voltage from the second voltage-generating circuit.

2. The semiconductor memory device of claim 1, wherein the X-hole comprises a plurality of the voltage-generating circuits.

3. The semiconductor memory device of claim 1, wherein the voltage-generating circuit of the X-hole comprises a single voltage-generating circuit.

4. The semiconductor memory device of claim 1, wherein each capacitor from the plurality of capacitors have one end connected to a voltage line through which the internal voltage is transmitted, and another end connected to a ground voltage.

5. The semiconductor memory device of claim 1, wherein the first internal voltage is different from a voltage level of the second internal voltage.

* * * * *